US009117915B2

(12) United States Patent
Lu et al.

(10) Patent No.: US 9,117,915 B2
(45) Date of Patent: Aug. 25, 2015

(54) THIN FILM TRANSISTOR, PIXEL STRUCTURE AND METHOD FOR FABRICATING THE SAME

(75) Inventors: Chang-Ming Lu, Pingtung County (TW); Lun Tsai, Taichung (TW); Chia-Yu Chen, Hsinchu County (TW)

(73) Assignee: Au Optronics Corporation, Hsinchu (TW)

( * ) Notice: Subject to any disclaimer, the term of this patent is extended or adjusted under 35 U.S.C. 154(b) by 774 days.

(21) Appl. No.: 13/303,149

(22) Filed: Nov. 23, 2011

(65) Prior Publication Data

US 2013/0043464 A1    Feb. 21, 2013

(30) Foreign Application Priority Data

Aug. 15, 2011    (TW) .............................. 100129093 A

(51) Int. Cl.
*H01L 21/16*    (2006.01)
*H01L 29/786*    (2006.01)
*G02F 1/1368*    (2006.01)

(52) U.S. Cl.
CPC .......... *H01L 29/7869* (2013.01); *G02F 1/1368* (2013.01); *H01L 29/78693* (2013.01)

(58) Field of Classification Search
None
See application file for complete search history.

(56) References Cited

U.S. PATENT DOCUMENTS

| 4,715,930 | A | * | 12/1987 | Diem | 438/160 |
| 6,323,521 | B1 | | 11/2001 | Seo | |
| 6,916,691 | B1 | | 7/2005 | Lai | |
| 8,058,116 | B2 | | 11/2011 | Bae et al. | |
| 2008/0135846 | A1 | * | 6/2008 | Shin et al. | 257/59 |
| 2010/0029049 | A1 | | 2/2010 | Do et al. | |
| 2010/0117090 | A1 | * | 5/2010 | Roh et al. | 257/72 |
| 2010/0127257 | A1 | * | 5/2010 | Ryu et al. | 257/43 |
| 2010/0173451 | A1 | * | 7/2010 | Cho et al. | 438/99 |
| 2010/0182525 | A1 | * | 7/2010 | Choung et al. | 349/43 |
| 2010/0193782 | A1 | * | 8/2010 | Sakata | 257/43 |
| 2010/0301325 | A1 | | 12/2010 | Bae et al. | |
| 2012/0012839 | A1 | | 1/2012 | Bae et al. | |

FOREIGN PATENT DOCUMENTS

| CN | 101075583 | 11/2007 |
| CN | 101197333 | 6/2008 |
| CN | 101901787 | 12/2010 |
| JP | 4-367268 A | 12/1992 |
| JP | H0918006 | 1/1997 |

OTHER PUBLICATIONS

"Second Office Action of China Counterpart Application", issued on Jan. 13, 2014, p. 1-p. 7.
"First Office Action of China Counterpart Application", issued on May 29, 2013, p. 1-p. 9.

* cited by examiner

*Primary Examiner* — Evan Pert
*Assistant Examiner* — Herve Assouman
(74) *Attorney, Agent, or Firm* — Jianq Chyun IP Office

(57) ABSTRACT

A thin film transistor (TFT) that includes a gate, an oxide semiconductor layer, a gate insulator, a source, and a drain is provided. The gate insulator is located between the oxide semiconductor layer and the gate. The source and the drain are in contact with different portions of the oxide semiconductor layer. Each of the source and the drain has a ladder-shaped sidewall that is partially covered by the oxide semiconductor layer. A method for fabricating the above-mentioned TFT is also provided.

4 Claims, 9 Drawing Sheets

THIN FILM TRANSISTOR, PIXEL STRUCTURE AND METHOD FOR FABRICATING THE SAME

CROSS-REFERENCE TO RELATED APPLICATION

This application claims the priority benefit of Taiwan application serial no. 100129093, filed on Aug. 15, 2011. The entirety of the above-mentioned patent application is hereby incorporated by reference herein and made a part of this specification.

BACKGROUND OF THE INVENTION

1. Field of the Invention

The invention relates to a thin film transistor (TFT), a pixel structure, and a method for fabricating the same. More particularly, the invention relates to a TFT having an oxide semiconductor layer, a pixel structure, and a method for fabricating the TFT and the pixel structure.

2. Description of Related Art

With the advancement in technology, bulky cathode ray tube (CRT) displays have been gradually replaced by flat panel displays including liquid crystal displays (LCDs), organic electro-luminescent displays, field emission displays (FEDs), and plasma display panels (PDPs). Among the flat panel displays, the LCDs are most popular.

In the most well-known thin film transistor liquid crystal display (TFT-LCD), reliability of the TFT poses a direct impact on the manufacturing yield of the TFT-LCD. Accordingly, how to further improve the manufacturing yield of the TFT is one of the research topics at this current stage.

SUMMARY OF THE INVENTION

The invention is directed to a TFT and a method for fabricating the same to effectively improve the manufacturing yield of the TFT.

The invention is further directed to a pixel structure and a method for fabricating the same to effectively improve the manufacturing yield of the pixel structure.

In an embodiment of the invention, a TFT that includes a gate, an oxide semiconductor layer, a gate insulator, a source, and a drain is provided. The gate insulator is located between the oxide semiconductor layer and the gate. The source and the drain are respectively in contact with different portions of the oxide semiconductor layer, and each of the source and the drain has a ladder-shaped sidewall that is partially covered by the oxide semiconductor layer.

According to an embodiment of the invention, the gate and the gate insulator are located on a substrate. The gate insulator covers the gate. The source and the drain are located on the gate insulator. The oxide semiconductor layer covers a portion of the gate insulator, a portion of the source, and a portion of the drain.

According to an embodiment of the invention, a material of the oxide semiconductor layer includes indium-gallium-zinc oxide (IGZO), ZnO, SnO, indium-zinc oxide (IZO), gallium-zinc oxide (GZO), zinc-tin oxide (ZTO), or indium-tin oxide (ITO).

According to an embodiment of the invention, the thickness of the oxide semiconductor layer is less than the thickness of the source and is less than the thickness of the drain. For instance, the thickness of the oxide semiconductor layer ranges from about 100 Å to about 2000 Å, and the thickness of the source and the thickness of the drain respectively range from about 2000 Å to about 20000 Å.

In an embodiment of the invention, a pixel structure that includes a TFT and a pixel electrode is provided. The TFT includes a gate, an oxide semiconductor layer, a gate insulator, a source, and a drain. The gate insulator is located between the oxide semiconductor layer and the gate. The source and the drain are respectively in contact with different portions of the oxide semiconductor layer, and each of the source and the drain has a ladder-shaped sidewall. The pixel electrode is electrically connected to the drain and covers at least one portion of the ladder-shaped sidewall of the drain.

According to an embodiment of the invention, the gate and the gate insulator are located on a substrate. The gate insulator covers the gate. The oxide semiconductor layer is located on the gate insulator. The source and the drain cover a portion of the oxide semiconductor layer and a portion of the gate insulator.

According to an embodiment of the invention, the oxide semiconductor layer and the gate insulator are located on a substrate. The gate insulator covers the oxide semiconductor layer, and the gate is located on the gate insulator. The source and the drain are respectively in contact with different portions of the oxide semiconductor layer.

According to an embodiment of the invention, the pixel structure can further include an insulation layer that covers the gate and the gate insulator. The gate insulator and the insulation layer have a plurality of contact openings to expose a portion of the oxide semiconductor layer. The source and the drain are in contact with the different portions of the oxide semiconductor layer through the contact openings.

In an embodiment of the invention, a method for fabricating a TFT includes following steps. Sequentially form a gate and a gate insulator on a substrate. The gate insulator covers the gate. Form a source and a drain on the gate insulator, and each of the source and the drain respectively has a ladder-shaped sidewall. Form an oxide semiconductor layer on the gate insulator to cover at least one portion of the ladder-shaped sidewall of the source and at least one portion of the ladder-shaped sidewall of the drain. The source and the drain are respectively in contact with different portions of the oxide semiconductor layer.

According to an embodiment of the invention, the step of forming the source and the drain respectively having the ladder-shaped sidewall includes following steps. Form a conductive material layer on the gate insulator. Form a patterned photoresist layer on the conductive material layer, and a portion of the conductive material layer is exposed. Partially remove the portion of the conductive material layer exposed by the patterned photoresist layer with use of the patterned photoresist layer as a mask, so as to form a recess pattern in the conductive material layer. Remove a portion of the patterned photoresist layer to form a residual patterned photoresist layer. The residual patterned photoresist layer further exposes a portion of the conductive material layer covered by the patterned photoresist layer. Partially remove the portion of the conductive material layer exposed by the residual patterned photoresist layer with use of the residual patterned photoresist layer as a mask until a portion of the gate insulator is exposed, so as to form the ladder-shaped sidewall of the source and the ladder-shaped sidewall of the drain.

According to an embodiment of the invention, the step of forming the source and the drain respectively having the ladder-shaped sidewall includes following steps: (a) forming a conductive material layer on the gate insulator; (b) forming a patterned photoresist layer on the conductive material layer and exposing a portion of the conductive material layer; (c)

partially removing the portion of the conductive material layer exposed by the patterned photoresist layer with use of the patterned photoresist layer as a mask, so as to form a recess pattern in the conductive material layer; (d) removing a portion of the patterned photoresist layer to form a residual patterned photoresist layer, the residual patterned photoresist layer further exposing a portion of the conductive material layer covered by the patterned photoresist layer; (e) partially removing the portion of the conductive material layer exposed by the residual patterned photoresist layer with use of the residual patterned photoresist layer as a mask; and (f) repeating step (d)~step (e) at least once until a portion of the gate insulator is exposed to form the ladder-shaped sidewall of the source and the ladder-shaped sidewall of the drain.

According to an embodiment of the invention, the step of forming the source and the drain having the ladder-shaped sidewall includes following steps. Form a conductive material layer on the gate insulator. Form a half-tone patterned photoresist layer on the conductive material layer, and a portion of the conductive material layer is exposed. Here, the half-tone patterned photoresist layer has a ladder-shaped sidewall. Partially remove the portion of the conductive material layer exposed by the half-tone patterned photoresist layer with use of the half-tone patterned photoresist layer as a mask until a portion of the gate insulator is exposed.

In an embodiment of the invention, a method for fabricating a pixel structure includes following steps. Form a TFT on a substrate. The TFT includes a gate, an oxide semiconductor layer, a gate insulator, a source, and a drain. The gate insulator is configured between the oxide semiconductor layer and the gate. The source and the drain are respectively in contact with different portions of the oxide semiconductor layer, and each of the source and the drain has a ladder-shaped sidewall. Form a pixel electrode electrically connected to the drain is formed, and the pixel electrode covers at least one portion of the ladder-shaped sidewall of the drain.

According to an embodiment of the invention, the step of forming the TFT includes following steps. Sequentially form the gate and the gate insulator on the substrate. Form the gate insulator to cover the gate. Form the oxide semiconductor layer on the gate insulator. Form the source and the drain on a portion of the oxide semiconductor layer and a portion of the gate insulator.

According to an embodiment of the invention, the step of forming the TFT includes following steps. Sequentially form the oxide semiconductor layer and the gate insulator on the substrate, and the gate insulator covers the oxide semiconductor layer. Form the gate on the gate insulator. Form an insulation layer on the gate and the gate insulator. The gate insulator and the insulation layer have a plurality of contact openings to expose a portion of the oxide semiconductor layer. Form the source and the drain on the insulation layer. Here, the source and the drain are in contact with the different portions of the oxide semiconductor layer through the contact openings.

According to an embodiment of the invention, a material of the pixel electrode is zinc-tin oxide (ZTO) or indium-tin oxide (ITO), for instance.

Based on the above, the source and the drain respectively having the ladder-shaped sidewall can effectively improve the manufacturing yield of the TFT and the pixel structure.

To make the above and other features and advantages of the application more comprehensible, several embodiments accompanied with figures are detailed as follows.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DESCRIPTION OF EMBODIMENTS

Figure 1:
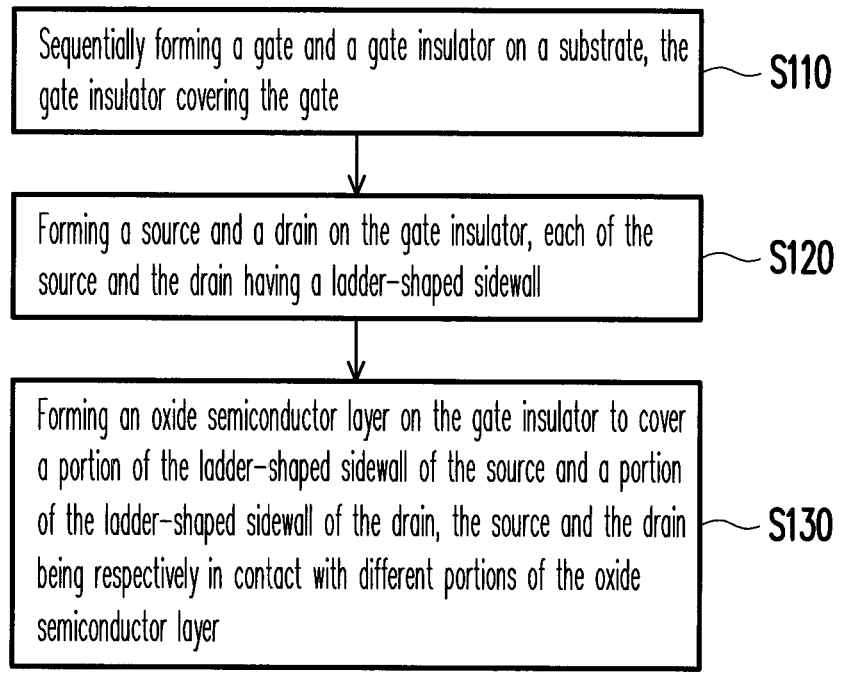
FIG. 1 is a schematic view illustrating a process of manufacturing a TFT according to an embodiment of the invention.

FIG. 1 is a schematic view illustrating a process of manufacturing a TFT according to an embodiment of the invention. With reference to FIG. 1, a method for fabricating a TFT according to this embodiment includes steps S110~S130 as provided below. In step S110, sequentially form a gate and a gate insulator on a substrate, and the gate insulator covers the gate. In step S120, form a source and a drain on the gate insulator, and each of the source and the drain has a ladder-shaped sidewall. In step S130, form an oxide semiconductor layer on the gate insulator to cover at least one portion of the ladder-shaped sidewall of the source and the ladder-shaped sidewall of the drain, and the source and the drain are respectively in contact with different portions of the oxide semiconductor layer.

The steps S110~S130 are elaborated in the first and second embodiments provided below.

First Embodiment

Figure 2A:
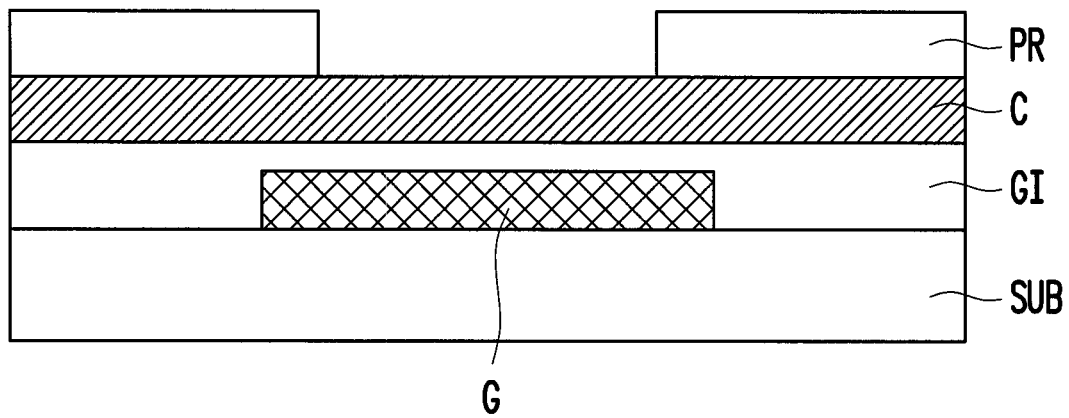
FIG. 2A through FIG. 2F are schematic cross-sectional view illustrating a process of fabricating a pixel structure according to a first embodiment of the invention.

FIG. 2A through FIG. 2F are schematic cross-sectional view illustrating a process of fabricating a pixel structure according to a first embodiment of the invention. With reference to FIG. 1 and FIG. 2A, in step S110, a gate G and a gate insulator GI are sequentially formed on a substrate SUB, and the gate insulator GI covers the gate G. According to this embodiment, the gate G is formed by performing a photolithography and etching process, for instance, and a material of the gate G includes metal, alloy, or any other conductive material. In addition, the gate insulator GI is formed on the substrate SUB by chemical vapor deposition, for instance, so as to cover the gate G According to this embodiment, the gate insulator GI is made of silicon oxide, silicon nitride, or any other dielectric material, for instance.

Figure 2B:
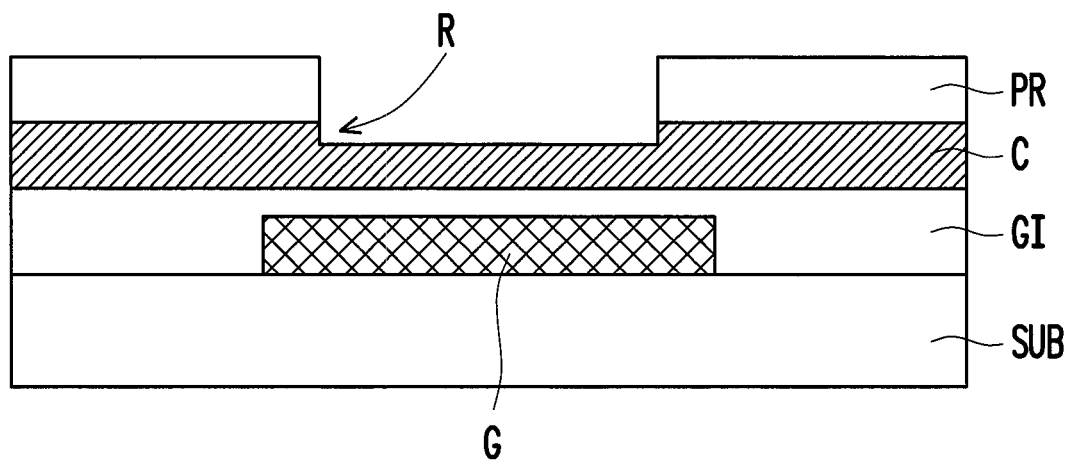
Figure 2C:
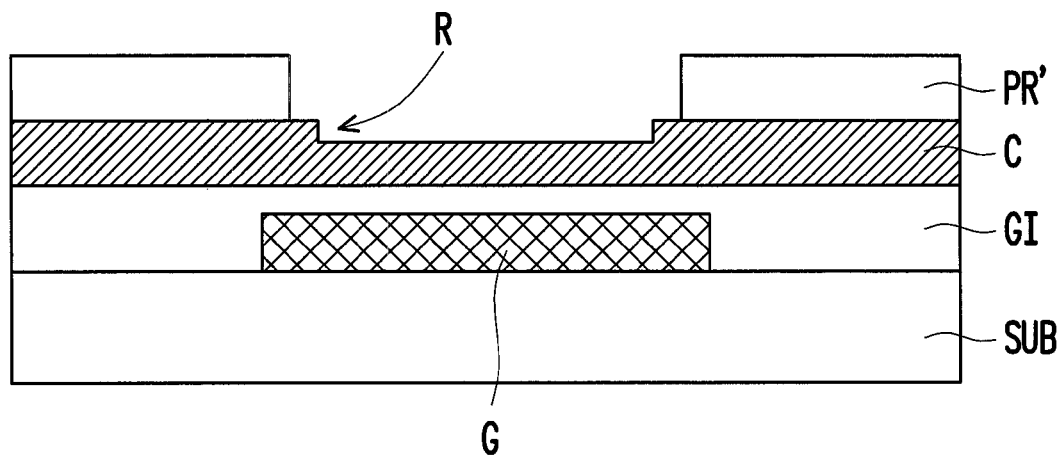
Figure 2D:
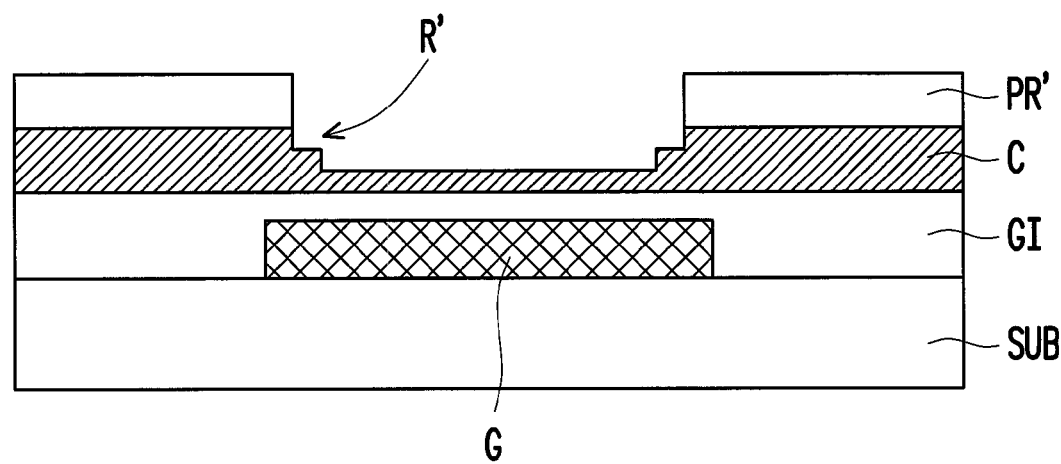
Figure 2E:
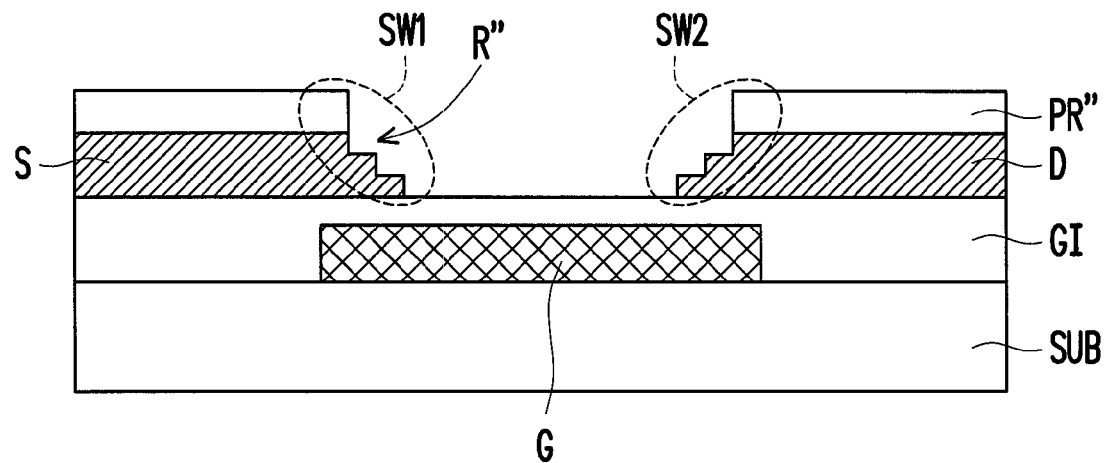

With reference to FIG. 2A and FIG. 2E, after the gate insulator GI (shown in FIG. 2A) is formed, a source S having a ladder-shaped sidewall SW1 and a drain D having a ladder-shaped sidewall SW2 are formed in step S120 (as indicated in FIG. 2E).

As shown in FIG. 2A, a conductive material layer C is formed on the gate insulator GI. A patterned photoresist layer PR is formed on the conductive material layer C to expose a portion of the conductive material layer C. In this embodiment, the portion of the conductive material layer C exposed by the patterned photoresist layer PR is located above the gate G The patterned photoresist layer PR is formed by exposure and development, for instance, and the material of the patterned photoresist layer PR is not limited in this embodiment.

As indicated in FIG. 2B, the portion of the conductive material layer C exposed by the patterned photoresist layer PR is partially removed with use of the patterned photoresist layer PR as a mask, so as to form a recess pattern R in the conductive material layer C. In this embodiment, the depth of the recess pattern R is less than the thickness of the conductive material layer C.

With reference to FIG. 2C, a portion of the patterned photoresist layer PR (shown in FIG. 2B) is removed to form a residual patterned photoresist layer PR'. The residual pattern photoresist layer PR' not only exposes the recess pattern R (shown in FIG. 2B) but also exposes a portion of the conductive material layer C covered by the patterned photoresist layer PR (shown in FIG. 2B). In this embodiment, the portion of the patterned photoresist layer PR is removed to form the residual patterned photoresist layer PR' by performing a plasma ashing process or any other process that can remove the photoresist material, for instance. Note that the thickness and the width of the patterned photoresist layer PR are reduced in the plasma ashing process for removing the portion of the patterned photoresist layer PR. Namely, the thickness and the width of the residual patterned photoresist layer PR' are less than those of the patterned photoresist layer PR (shown in FIG. 2B), and thus the portion of the conductive material layer C covered by the patterned photoresist layer PR (shown in FIG. 2B) can be exposed by the residual patterned photoresist layer PR'.

As indicated in FIG. 2D, the portion of the conductive material layer C exposed by the residual patterned photoresist layer PR' is partially removed with use of the residual patterned photoresist layer PR' as a mask, so as to form a recess pattern R' in the conductive material layer C. At this time, the depth of the recess pattern R' is less than the thickness of the conductive material layer C. Namely, the recess pattern R' does not expose the gate insulator GI.

With reference to FIG. 2E, a portion of the residual patterned photoresist layer PR' (shown in FIG. 2D) is removed to form a residual patterned photoresist layer PR". The residual pattern photoresist layer PR" not only exposes the recess pattern R' (shown in FIG. 2D) but also exposes a portion of the conductive material layer C covered by the residual patterned photoresist layer PR' (shown in FIG. 2D). The portion of the conductive material layer C exposed by the residual patterned photoresist layer PR" is partially removed with use of the residual patterned photoresist layer PR" as a mask, so as to form a recess pattern R" in the conductive material layer C. At this time, the gate insulator GI is partially exposed, and the conductive material layer C (shown in FIG. 2D) is patterned to form the source S having the ladder-shaped sidewall SW1 and the drain D having the ladder-shaped sidewall SW2.

In the process of forming the source S and the drain D, it is not necessary to perform the three-stage removing process (respectively shown in FIG. 2B, FIG. 2D, and FIG. 2E) in this embodiment. That is to say, a two-stage removing process or an n-stage removing process (n≥4) is applicable for forming the source S and the drain D in this embodiment.

Figure 2F:
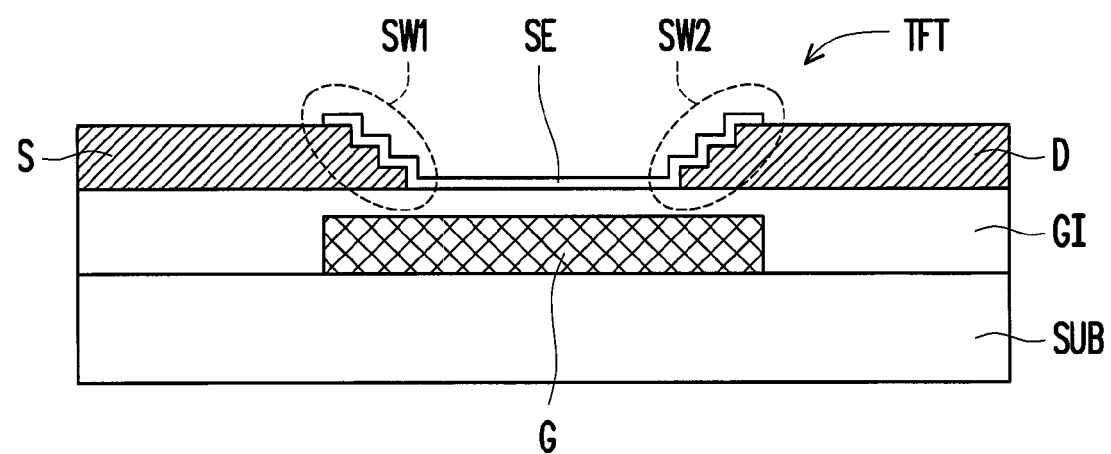

With reference to FIG. 2F, after the source S and the drain D are formed, an oxide semiconductor layer SE is formed on the gate insulator GI to cover a portion of the ladder-shaped sidewall SW1 of the source S and a portion of the ladder-shaped sidewall SW2 of the drain D, and the source S and the drain D are respectively in contact with different portions of the oxide semiconductor layer SE (step S130). In this embodiment, the oxide semiconductor layer SE is made of IGZO, ZnO, SnO, IZO, GZO, ZTO, or ITO, for instance. The thin film transistor TFT of this embodiment is entirely formed upon the complete fabrication of the oxide semiconductor layer SE.

With reference to FIG. 2F, the thin film transistor TFT of this embodiment includes the gate G, the oxide semiconductor layer SE, the gate insulator GI, the source S, and the drain D. The gate insulator GI is located between the oxide semiconductor layer SE and the gate G. The source S and the drain D are respectively in contact with different portions of the oxide semiconductor layer SE. Besides, the source S has the ladder-shaped sidewall SW1, and the drain D has the ladder-shaped sidewall SW2. The oxide semiconductor layer SE covers a portion of the ladder-shaped sidewall SW1 and a portion of the ladder-shaped sidewall SW2. Specifically, the gate G and the gate insulator GI are located on the substrate SUB. The gate insulator GI covers the gate G The source S and the drain D are located on the gate insulator GI. The oxide semiconductor layer SE covers a portion of the gate insulator GI, a portion of the source S, and a portion of the drain D.

In this embodiment, the thickness of the oxide semiconductor layer SE is less than the thickness of the source S and is less than the thickness of the drain D. For instance, the thickness of the oxide semiconductor layer SE ranges from about 100 Å to about 2000 Å, and the thickness of the source S and the thickness of the drain D respectively range from about 2000 Å to about 20000 Å.

Note that it is well-known to people having ordinary skill in the art to further form a protection layer (not shown) on the thin film transistor TFT for improving device reliability. In addition, if the thin film transistor TFT of this embodiment is going to be applied in a display panel, a pixel electrode (not shown) electrically connected to the drain D can be further formed.

Second Embodiment

Figure 3A:
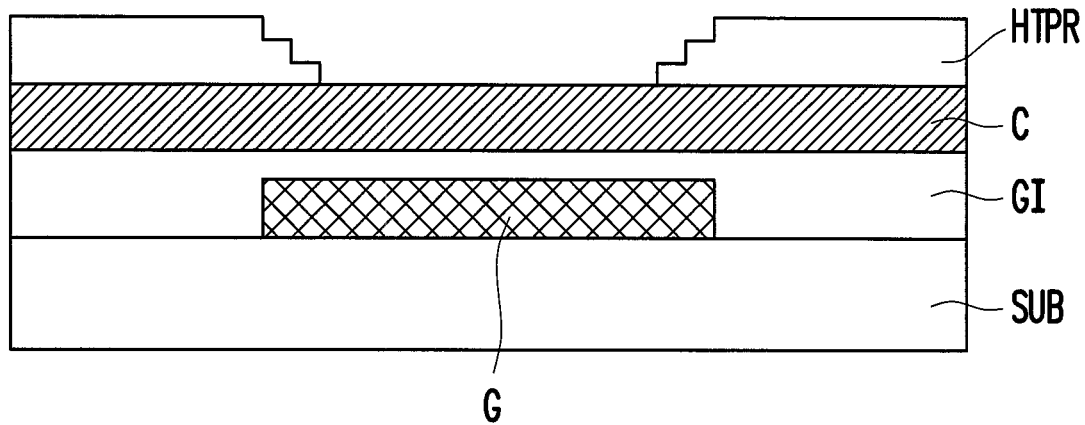
FIG. 3A through FIG. 3G are schematic cross-sectional view illustrating a process of fabricating a pixel structure according to a second embodiment of the invention.

FIG. 3A through FIG. 3G are schematic cross-sectional view illustrating a process of fabricating a pixel structure according to a second embodiment of the invention. With reference to FIG. 1 and FIG. 3A, in step S110, a gate G and a gate insulator GI are sequentially formed on a substrate SUB, and the gate insulator GI covers the gate G. According to this embodiment, the gate G is formed by performing a photolithography and etching process, for instance, and a material of the gate G includes metal, alloy, or any other conductive material. In addition, the gate insulator GI is formed on the substrate SUB by chemical vapor deposition, for instance, so as to cover the gate G According to this embodiment, the gate insulator GI is made of silicon oxide, silicon nitride, or any other dielectric material, for instance.

Figure 3B:
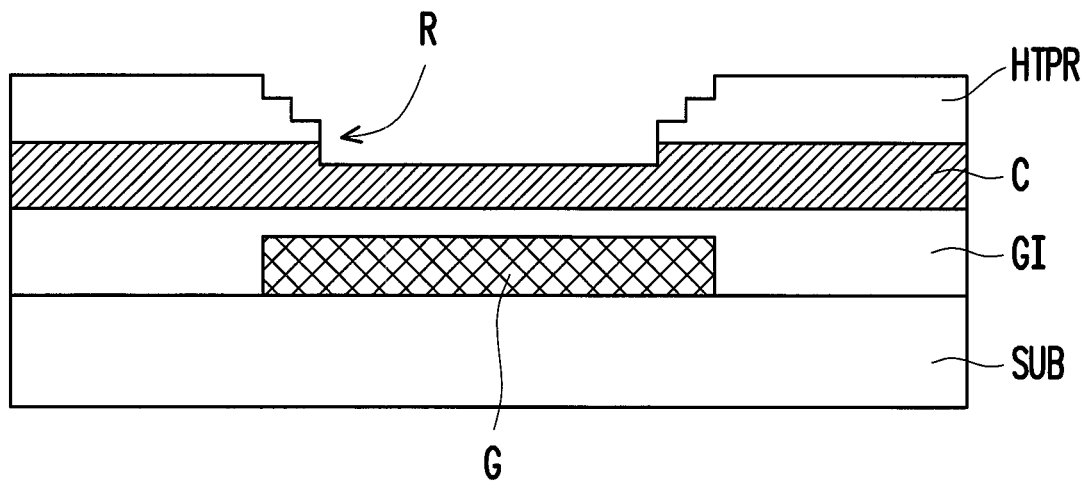
Figure 3C:
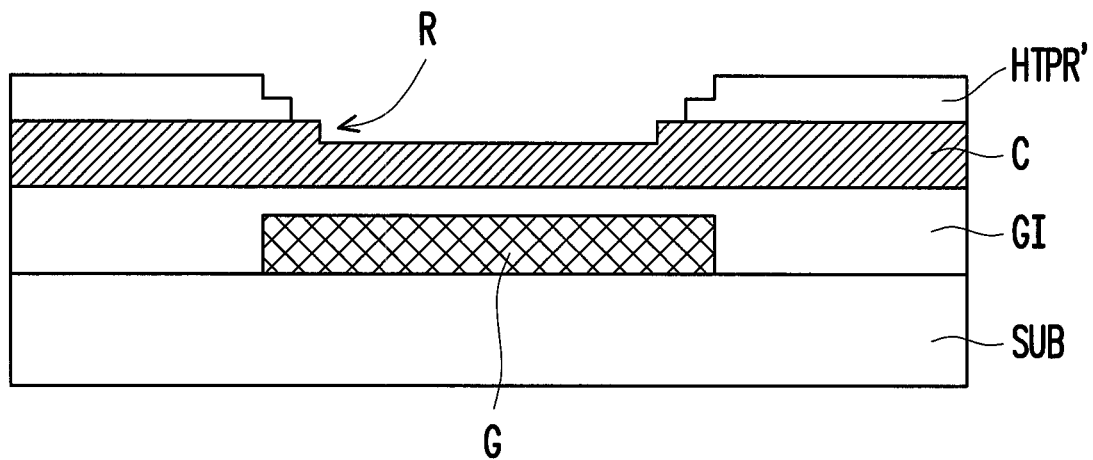
Figure 3D:
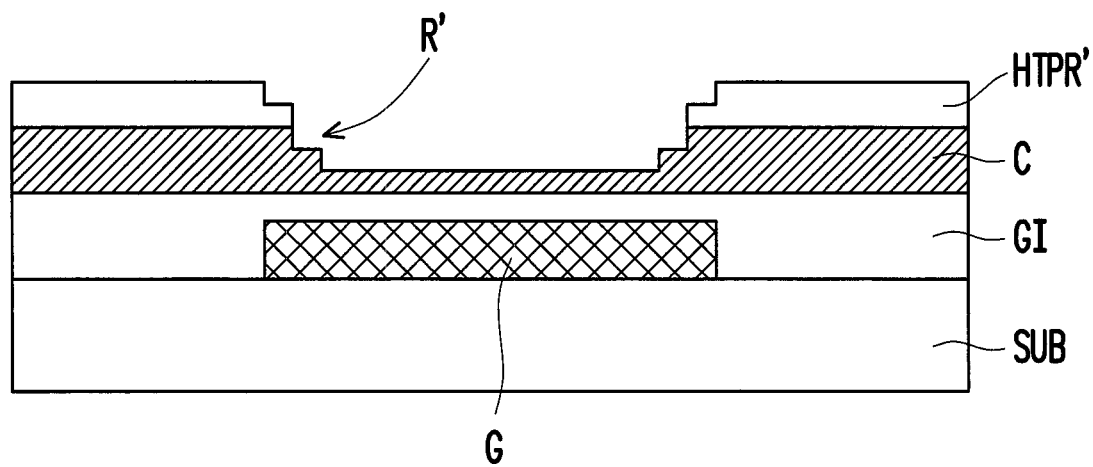
Figure 3E:
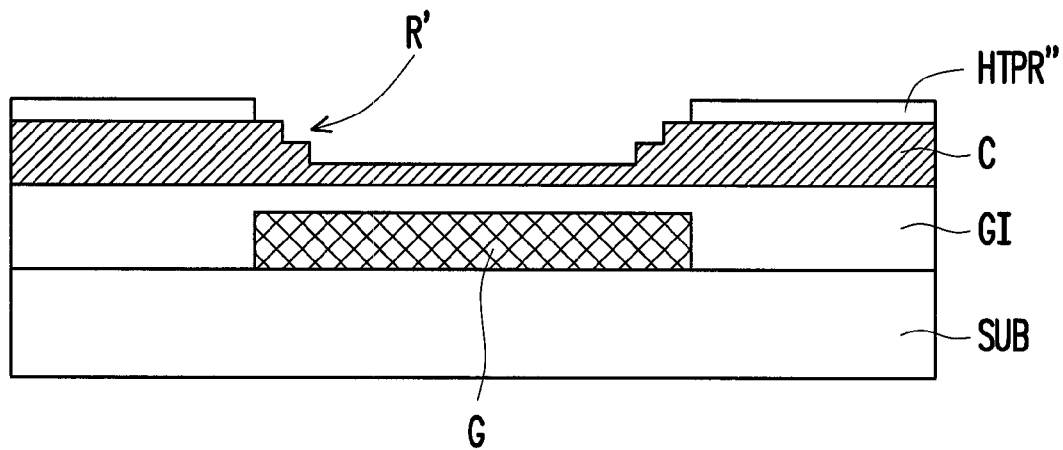
Figure 3F:
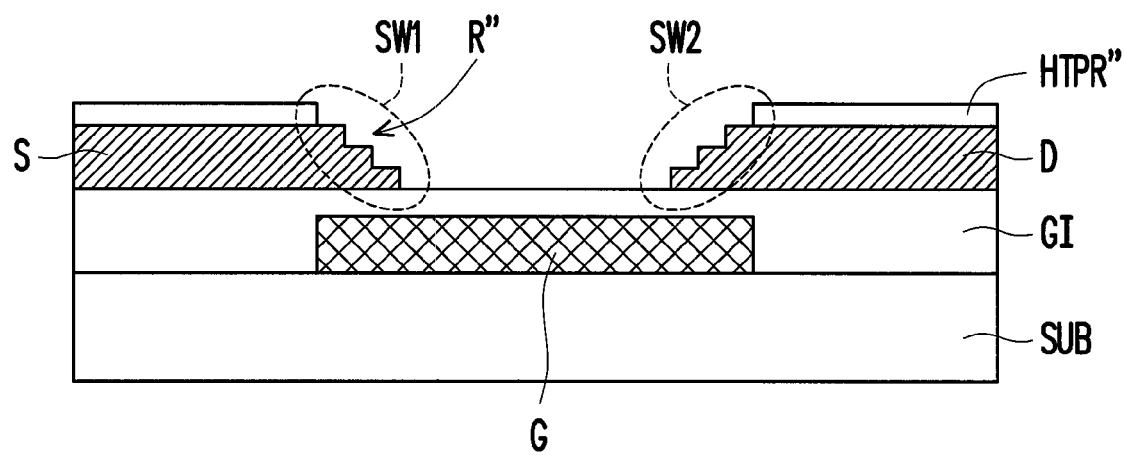

With reference to FIG. 3A and FIG. 3F, after the gate insulator GI (shown in FIG. 3A) is formed, a source S having a ladder-shaped sidewall SW1 and a drain D having a ladder-shaped sidewall SW2 are formed in step S120 (as indicated in FIG. 3F).

As shown in FIG. 3A, a conductive material layer C is formed on the gate insulator GI. A half-tone patterned photoresist layer HTPR is formed on the conductive material layer C to expose a portion of the conductive material layer C. Here, the half-tone patterned photoresist layer HTPR has a ladder-shaped sidewall SW. In this embodiment, the half-tone patterned photoresist layer HTPR exposes the portion of the conductive material layer C which is located above the gate G Besides, the half-tone patterned photoresist layer HTPR is formed by performing an exposure and development process with use of a half-tone photo mask, for instance, and the material of the half-tone patterned photoresist layer HTPR is not limited in this embodiment.

As indicated in FIG. 3B, the portion of the conductive material layer C exposed by the half-tone patterned photoresist layer HTPR is partially removed with use of the half-tone patterned photoresist layer HTPR as a mask, so as to form a recess pattern R in the conductive material layer C. In this embodiment, the depth of the recess pattern R is less than the thickness of the conductive material layer C.

With reference to FIG. 3C, a portion of the half-tone patterned photoresist layer HTPR (shown in FIG. 3B) is removed to form a residual half-tone patterned photoresist layer HTPR'. The residual half-tone pattern photoresist layer HTPR' not only exposes the recess pattern R (shown in FIG. 3B) but also exposes a portion of the conductive material layer C covered by the half-tone patterned photoresist layer HTPR (shown in FIG. 3B). In this embodiment, the portion of the half-tone patterned photoresist layer HTPR is removed to form the residual half-tone patterned photoresist layer HTPR' by performing a plasma ashing process or any other process that can remove the photoresist material, for instance. Note that the thickness and the width of the half-tone patterned photoresist layer HTPR are both reduced in the plasma ashing process for removing the portion of the half-tone patterned photoresist layer HTPR. Namely, the thickness and the width of the residual half-tone patterned photoresist layer HTPR' are less than those of the half-tone patterned photoresist layer HTPR (shown in FIG. 3B), and thus the portion of the conductive material layer C covered by the half-tone patterned photoresist layer HTPR (shown in FIG. 3B) can be exposed by the residual half-tone patterned photoresist layer HTPR'.

As indicated in FIG. 3D, the portion of the conductive material layer C exposed by the residual half-tone patterned photoresist layer HTPR' is partially removed with use of the residual half-tone patterned photoresist layer HTPR' as a mask, so as to form a recess pattern R' in the conductive material layer C. At this time, the depth of the recess pattern R' is smaller than the thickness of the conductive material layer C. Namely, the recess pattern R' does not expose the gate insulator GI.

With reference to FIG. 3E, a portion of the residual patterned photoresist layer HTPR' (shown in FIG. 3D) is removed to form a residual patterned photoresist layer HTPR''. The residual pattern photoresist layer HTPR'' not only exposes the recess pattern R' (shown in FIG. 3D) but also exposes a portion of the conductive material layer C covered by the residual patterned photoresist layer HTPR' (shown in FIG. 3D).

As indicated in FIG. 3F, the portion of the conductive material layer C exposed by the residual half-tone patterned photoresist layer HTPR'' is partially removed with use of the residual half-tone patterned photoresist layer HTPR'' as a mask, so as to form a recess pattern R'' in the conductive material layer C. At this time, the gate insulator GI is partially exposed, and the conductive material layer C (shown in FIG. 3E) is patterned to form the source S having the ladder-shaped sidewall SW1 and the drain D having the ladder-shaped sidewall SW2.

It should be mentioned that the profile of the ladder-shaped sidewalls SW1 and SW2 is determined by the ladder-shaped sidewall SW of the half-tone patterned photoresist layer HTPR, and thus people having ordinary skill in the art can properly adjust the profile of the ladder-shaped sidewall SW to obtain the required ladder-shaped sidewalls SW1 and SW2.

Figure 3G:
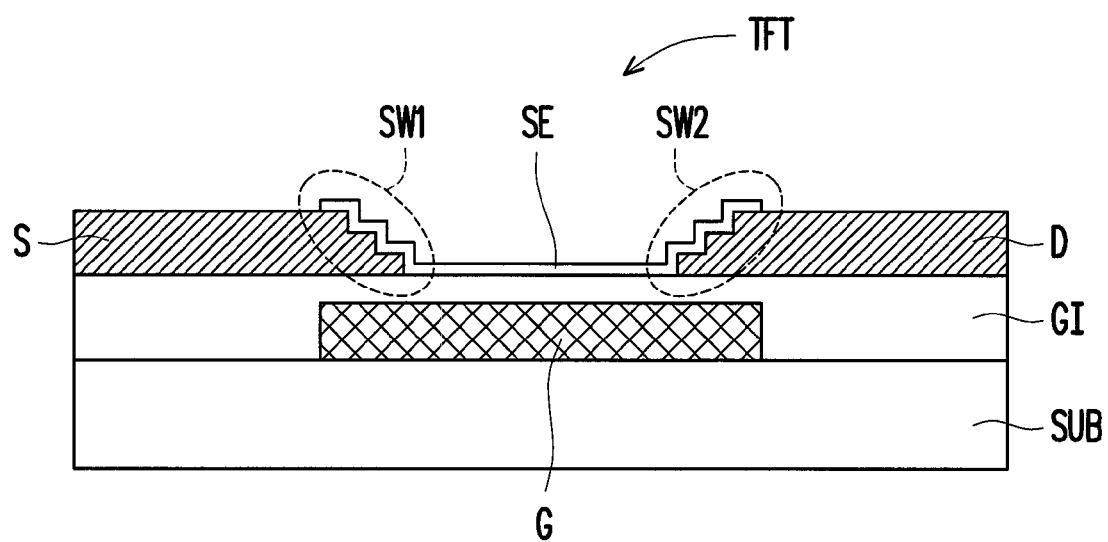

With reference to FIG. 3G, after the source S and the drain D are formed, an oxide semiconductor layer SE is formed on the gate insulator GI to cover a portion of the ladder-shaped sidewall SW1 of the source S and a portion of the ladder-shaped sidewall SW2 of the drain D, and the source S and the drain D are respectively in contact with different portions of the oxide semiconductor layer SE (step S130). In this embodiment, the oxide semiconductor layer SE is made of IGZO, ZnO, SnO, IZO, GZO, ZTO, or ITO, for instance. The thin film transistor TFT of this embodiment is completely formed upon fabrication of the oxide semiconductor layer SE.

Note that it is well-known to people having ordinary skill in the art to further form a protection layer (not shown) on the thin film transistor TFT for improving device reliability. In addition, if the thin film transistor TFT of this embodiment is going to be applied in a display panel, a pixel electrode (not shown) electrically connected to the drain D can be further formed.

In the thin film transistor TFT described in the first and second embodiments, the source S has the ladder-shaped sidewall SW1, and the drain D has the ladder-shaped sidewall SW2. Hence, the oxide semiconductor layer SE that covers the ladder-shaped sidewalls SW1 and SW2 can have favorable step coverage and is not apt to be cracked.

In the previous embodiments, note that the lower surfaces of the source S and the drain D are substantially planar, and the ladder-shaped sidewalls SW1 and SW2 are inherent in the source S and the drain D and are not indirectly formed by other uneven lower structures.

Third Embodiment

Figure 4:
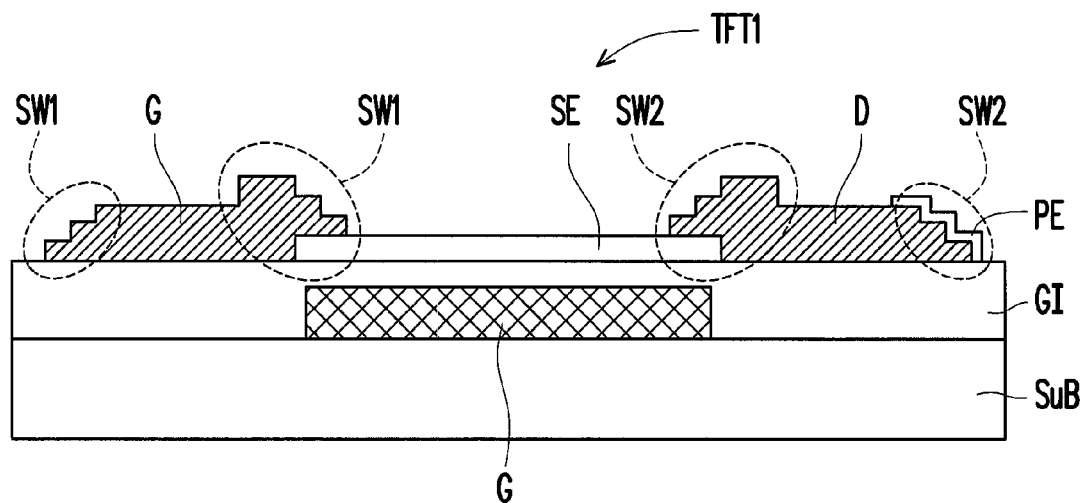
FIG. 4 is a schematic cross-sectional view illustrating a pixel structure according to a third embodiment of the invention.

FIG. 4 is a schematic cross-sectional view illustrating a pixel structure according to a third embodiment of the invention. With reference to FIG. 4, the pixel structure P1 includes a thin film transistor TFT1 and a pixel electrode PE. The thin film transistor TFT1 includes a gate G, an oxide semiconductor layer SE, a gate insulator GI, a source S, and a drain D. The gate insulator GI is located between the oxide semiconductor layer SE and the gate G The source S and the drain D are respectively in contact with different portions of the oxide semiconductor layer SE. Besides, the source S has a ladder-shaped sidewall SW1, and the drain D has a ladder-shaped sidewall SW2. The pixel electrode PE is electrically connected to the drain D and covers a portion of the ladder-shaped sidewall SW2 of the drain D. In this embodiment, as indicated in FIG. 4, the gate G and the gate insulator GI are located on a substrate SUB, the gate insulator GI covers the gate G, the oxide semiconductor layer SE is located on the gate insulator GI, and the source S and the drain D cover a portion of the oxide semiconductor layer SE and a portion of the gate insulator GI.

As indicated in FIG. 4, in this embodiment, after the thin film transistor TFT1 is formed on the substrate SUB, the pixel electrode PE is formed. Besides, the thin film transistor TFT1 of this embodiment is a bottom-gate TFT. Additionally, to form the thin film transistor TFT1, the gate G and the gate insulator GI are sequentially formed on the substrate SUB, the oxide semiconductor layer SE is formed on the gate insulator GI, and the source S and the drain D are formed on a portion of the oxide semiconductor layer SE and a portion of the gate insulator GI, for instance.

The source S has the ladder-shaped sidewall SW1, and the drain D has the ladder-shaped sidewall SW2. Hence, the pixel electrode PE covering the ladder-shaped sidewalls SW1 and SW2 has favorable step coverage and is not apt to be cracked.

Fourth Embodiment

Figure 5:
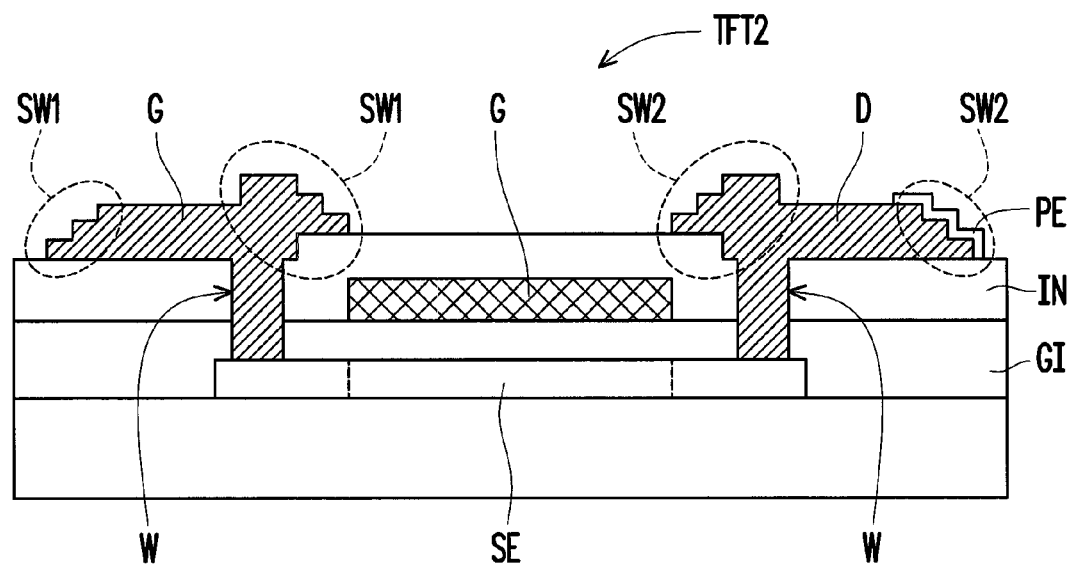
FIG. 5 is a schematic cross-sectional view illustrating a pixel structure according to a fourth embodiment of the invention.

FIG. 5 is a schematic cross-sectional view illustrating a pixel structure according to a fourth embodiment of the invention. With reference to FIG. 4 and FIG. 5, the pixel structure P2 in this embodiment is similar to the pixel structure P1 in the third embodiment, while one of the differences therebetween lies in that the pixel structure P2 has the top-gate thin film transistor TFT2 in this embodiment. Specifically, in the thin film transistor TFT2, the oxide semiconductor layer SE and the gate insulator GI are located on the substrate SUB. The gate insulator GI covers the oxide semiconductor layer SE, and the gate G is located on the gate insulator GI. The source S and the drain D are respectively in contact with different portions of the oxide semiconductor layer SE. Besides, the pixel structure P2 of this embodiment can further include an insulation layer IN that covers the gate G and the gate insulator GI. The gate insulator GI and the insulation layer IN have a plurality of contact openings W to expose a portion of the oxide semiconductor layer SE. The source S and the drain D are in contact with the different portions of the oxide semiconductor layer SE through the contact openings W.

As clearly shown in FIG. 5, to form the thin film transistor TFT2 of this embodiment, the oxide semiconductor layer SE and the gate insulator GI are sequentially formed on the substrate SUB, the gate G is formed on the gate insulator GI, the insulation layer IN is formed on the gate G and the gate insulator GI, and the contact openings W are formed in the gate insulator GI and the insulation layer IN to expose a portion of the oxide semiconductor layer SE. The source S and the drain D are then formed on the insulation layer IN. Here, the source S and the drain D are in contact with the different portions of the oxide semiconductor layer SE through the contact openings W.

The source S has the ladder-shaped sidewall SW1, and the drain D has the ladder-shaped sidewall SW2. Hence, the pixel electrode PE covering the ladder-shaped sidewalls SW1 and SW2 has favorable step coverage and is not apt to be cracked.

In view of the first, second, third, and fourth embodiments, the source and the drain respectively having the ladder-shaped sidewall can effectively improve the manufacturing yield of the TFT and the pixel structure.

Although the invention has been disclosed by the above embodiments, they are not intended to limit the invention. Those skilled in the art may make some modifications and alterations without departing from the spirit and scope of the invention. Therefore, the protection range of the invention falls in the appended claims.

What is claimed is:

1. A method for fabricating a thin film transistor, comprising:
    sequentially forming a gate and a gate insulator on a substrate, the gate insulator covering the gate;
    forming a source electrode and a drain electrode on the gate insulator, the source electrode and the drain electrode respectively having a ladder-shaped sidewall, wherein an entire lower surface of the source electrode and an entire lower surface of the drain electrode are substantially planar, and each of the source electrode and the drain electrode is a single one layer; and
    forming an oxide semiconductor layer on the gate insulator to cover at least one portion of the ladder-shaped sidewall of the source electrode and at least one portion of the ladder-shaped sidewall of the drain electrode, wherein the source electrode and the drain electrode are respectively in contact with different portions of the oxide semiconductor layer.

2. The method for fabricating the thin film transistor as recited in claim 1, wherein the ladder-shaped sidewall of each of the first source electrode and the drain electrode has three or more steps.

3. A method for fabricating a thin film transistor, comprising:
    sequentially forming a gate and a gate insulator on a substrate, the gate insulator covering the gate;
    forming a source electrode and a drain electrode on the gate insulator, the source electrode and the drain electrode respectively having a ladder-shaped sidewall, wherein the step comprises:
        (a) forming a conductive material layer on the gate insulator;
        (b) forming a patterned photoresist layer on the conductive material layer and exposing a portion of the conductive material layer;
        (c) partially removing the portion of the conductive material layer exposed by the patterned photoresist layer with use of the patterned photoresist layer as a mask, so as to form a recess pattern in the conductive material layer;
        (d) removing a portion of the patterned photoresist layer to form a residual patterned photoresist layer, the residual patterned photoresist layer further exposing a portion of the conductive material layer covered by the patterned photoresist layer; and
        (e) partially removing the portion of the conductive material layer exposed by the residual patterned photoresist layer with use of the residual patterned photoresist layer as a mask; and
    forming an oxide semiconductor layer on the gate insulator to cover at least one portion of the ladder-shaped sidewall of the source electrode and at least one portion of the ladder-shaped sidewall of the drain electrode, wherein the source electrode and the drain electrode are respectively in contact with different portions of the oxide semiconductor layer.

4. The method for fabricating the thin film transistor as recited in claim 3, wherein an entire top surface of the conductive material layer of step (a) is substantially planar.

* * * * *